United States Patent [19]

Lam

[11] Patent Number: 5,079,835
[45] Date of Patent: Jan. 14, 1992

[54] METHOD OF FORMING A CARRIERLESS SURFACE MOUNTED INTEGRATED CIRCUIT DIE

[75] Inventor: Man K. Lam, Colorado Springs, Colo.

[73] Assignee: Atmel Corporation, San Jose, Calif.

[21] Appl. No.: 596,690

[22] Filed: Oct. 12, 1990

[51] Int. Cl.⁵ .............................................. H05K 3/34
[52] U.S. Cl. ..................................... 29/840; 174/52.4; 361/414; 437/214
[58] Field of Search ................. 29/825, 830, 840, 846; 361/412, 415; 174/52.4

[56] References Cited

U.S. PATENT DOCUMENTS

| | | | |
|---|---|---|---|
| 3,398,232 | 8/1968 | Hoffman | 361/414 X |
| 3,483,308 | 12/1969 | Wakely | 437/214 X |
| 4,288,841 | 9/1981 | Gogal | 179/52.4 X |
| 4,423,468 | 12/1983 | Gatto et al. | 361/404 |
| 4,493,145 | 1/1985 | Honda | 29/840 |
| 4,538,346 | 9/1985 | Street | 29/840 X |
| 4,551,747 | 11/1985 | Gilbert et al. | 361/414 X |
| 4,572,757 | 2/1986 | Spadafora | 29/840 X |
| 4,682,207 | 7/1987 | Masaki et al. | 357/74 |
| 4,697,204 | 9/1987 | Mita et al. | 357/74 |
| 4,821,007 | 4/1989 | Fields et al. | 29/830 X |
| 4,860,443 | 8/1989 | Pesavento | 29/840 |
| 4,899,207 | 2/1990 | Hallowell et al. | 357/70 |

Primary Examiner—Carl J. Arbes
Attorney, Agent, or Firm—Schneck & McHugh

[57] ABSTRACT

An integrated circuit package and method of making the package which allows an integrated circuit die to be bonded to a substrate without need of a carrier. The integrated circuit die has opposed active and passive surfaces and has lateral surfaces. An electrically insulative layer of material is deposited on the passive and lateral surfaces. A metal mask is formed to cover the active surface and the coated lateral surfaces. The metal mask includes slots which extend up the lateral surfaces and onto the active surface. The array of slots corresponds to an array of input/output contact pads on the active side. Metal is sputtered into the slots, whereafter the mask is removed to provide L-shaped conductive traces from the contact pads along the active and lateral sides. The assembly can then be rested on a substrate on the passive surface and the L-shaped traces bonded to contact pads on the substrate. The assembly allows testing at the die level.

14 Claims, 2 Drawing Sheets

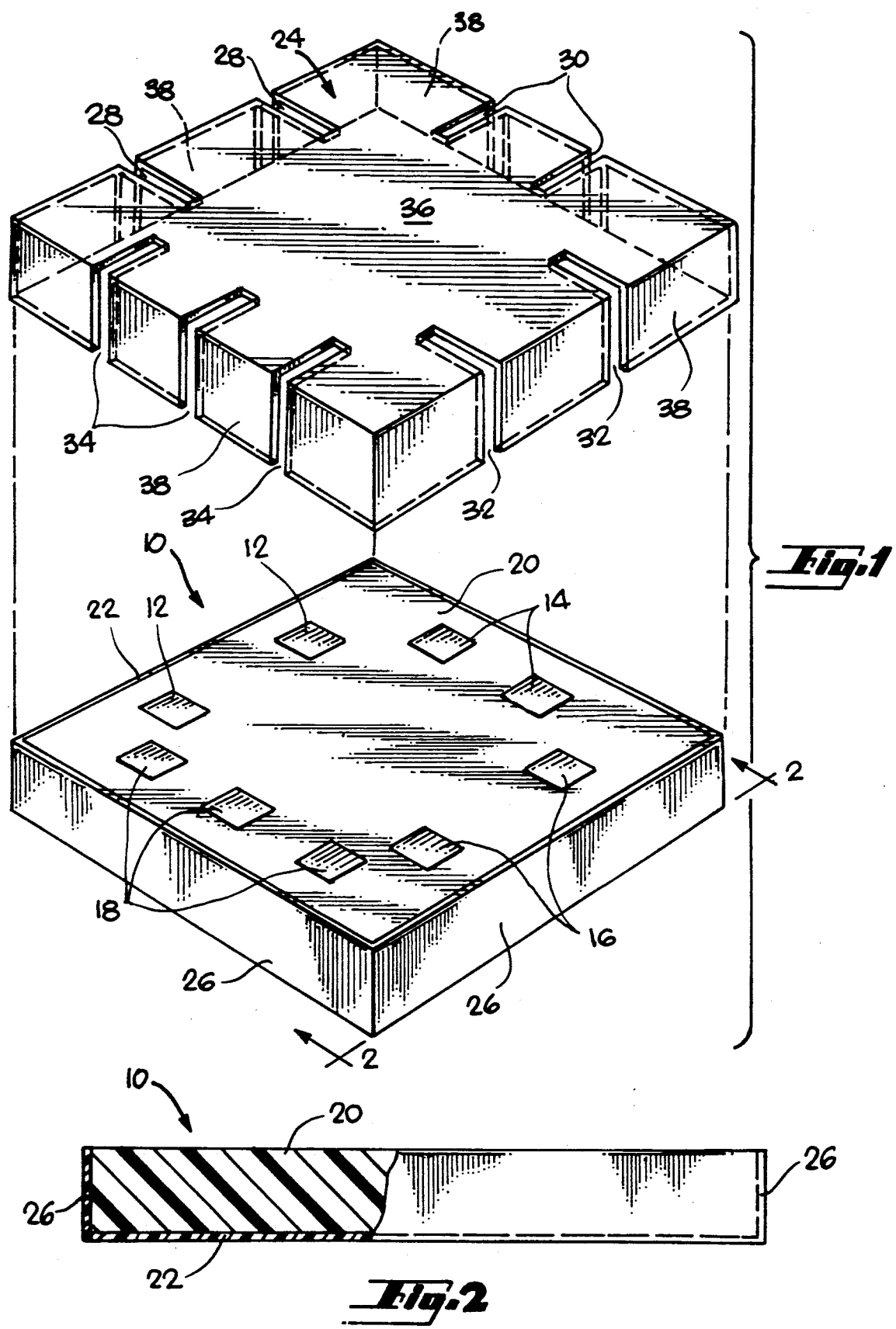

METHOD OF FORMING A CARRIERLESS SURFACE MOUNTED INTEGRATED CIRCUIT DIE

TECHNICAL FIELD

The present invention relates generally to assembly of electronic components and more particularly to leadless packaging of an integrated circuit chip.

BACKGROUND ART

Packaging of an integrated circuit die is receiving an increasing amount of attention from the manufacturers of electronic components. Packaging designers face more serious challenges as the circuit density of a given size integrated circuit die increases. The circuit density of a particular die typically plays a major role in the number of input/output signals associated with operation of the die. An increase in the input/output count affects a number of factors which must be considered by packaging designers.

Firstly, a high input/output count requires a correspondingly high interconnection density, both with respect to electrical couplings within the package and with respect to electrical couplings from the package to outside circuitry. A dense interconnection scheme is susceptible to electrical shorts.

A second factor follows from the first. An integrated circuit die having a dense interconnection scheme is typically associated with a relatively low manufacturing yield. Thus, a packaging design which facilitates testing at the die level is desirable.

A third factor involves heat dissipation. A dense integrated circuit die often requires a larger package so that the package is able to dissipate more heat than packages used for less dense integrated circuit dies. An ever present goal in the electronic industry is one of miniaturization. Consequently, packaging designers attempt to provide packages which require a minimal amount of real estate on a printed circuit board.

Yet another important factor is cost. While packaging significantly affects the cost of a packaged integrated circuit die, packaging should not dominate the overall cost.

The most common packages are dual-in-line packages (DIP), leadless chip carriers, leaded chip carriers, and pin-grids. Interconnection schemes to the contact pads of the die may be by wire bonding miniature wires to the pads or by flip-chip solder bonding to solder bumps formed at the pads. In either case, the interconnection scheme is difficult to connect to a testing device prior to completion of the packaging. The package itself is typically a ceramic or plastic material. Devices of this type are described in U.S. Pat. Nos. 4,423,468 to Gatto et al., 4,493,145 to Honda, 4,697,204 to Mita et al. and 4,682,207 to Akasaki et al.

Another interconnection technique is referred to as tape automated bonding and is described in U.S. Pat. No. 4,899,207 to Hallowell et al. This technique utilizes a plurality of conductive fingers having inner leads arranged in a pattern corresponding to the input/output pads of a particular integrated circuit die. The inner leads are bonded to the input/output pads, while radially outward outer leads are bonded to a printed circuit board or the like. One benefit of tape automated bonding is that the integrated circuit die may be easily tested prior to attachment of the outer leads to the printed circuit board.

It is an object of the present invention to provide an interconnection and packaging approach for integrated circuit dies which facilitates testing at the die level and which promotes miniaturization and high yield. It is a further object to provide such an approach which is cost efficient.

SUMMARY OF THE INVENTION

The above objects have been met by a packaging approach which eliminates the need of providing a carrier for an integrated circuit die prior to bonding of the die to a substrate. An integrated circuit die includes an active surface having an array of input/output contact pads for communication of the die with other circuitry. In the present invention, the die is inverted relative to its normal orientation of having the active surface proximate to the substrate on which the die is to be mounted.

An electrically insulating layer of material is formed on the inverted die so that the electrically insulating material covers a passive surface opposite to the active surface and covers the lateral surfaces of the die, but leaves the active surface exposed. A mask is then formed to cover the still-exposed active surface and the lateral surfaces. The mask includes slots which project from the input/output contact pads of the die to the edges of the active surface, and then down the electrically insulating material which covers the lateral surfaces. Metal is sputtered for deposition within the slots of the mask. The deposited metal forms traces having first ends at the input/output contact pads and having second ends substantially coterminus with the packaged die opposite to the active surface. The mask is then removed, leaving conductive traces which are L-shaped along the lateral surfaces and the active surface. The L-shaped traces may be deposited by utilization of other techniques. For example, the traces may be formed on the insulating material by use of photolithography or by a sputtering and etching technique known in the art.

The still inverted die is placed on a substrate having contact pads corresponding to the second ends of the conductive traces. The substrate contact pads are soldered to the second ends of the conductive traces for electrical communication between other circuitry bonded to the substrate and the integrated circuit die. The substrate may be a printed circuit board or may be a multi-chip carrier which is optionally hermetically sealed and mounted to a printed circuit board.

An advantage of the present invention is that the carrierless package allows testing at the integrated circuit die level. In multi-chip modules, a plurality of dies are installed and interconnected in a functional relationship. Multi-chip modules increase packaging density and operational speed but because of the greater number of dies, a multi-chip module is more likely to contain a defect than a single-chip package. Since the present invention exposes traces on an individual die, the die can be easily tested prior to interconnection within a multi-chip module.

Another advantage is that the package has a small "footprint", i.e., the contact pads on a substrate to which the die is to be bonded may be arranged within a small area, thus leaving a greater amount of substrate real estate for other devices. Another advantage relates to the cost of manufacture. Typical of the prior art is a two-step assembly system of interconnecting a die to a chip carrier and then interconnecting the chip carrier to a mother board. The present invention eliminates the need of the first step, thereby saving labor and material costs.

BRIEF DESCRIPTION OF THE DRAWINGS

FIG. 1 is a perspective view of an integrated circuit die and a mask positioned above the die for a step of packaging of the die in accord with present invention.

FIG. 2 is a side, partially sectional view of the die of FIG. 1, taken along lines 2—2.

BEST MODE FOR CARRYING OUT THE INVENTION

Figure 3:
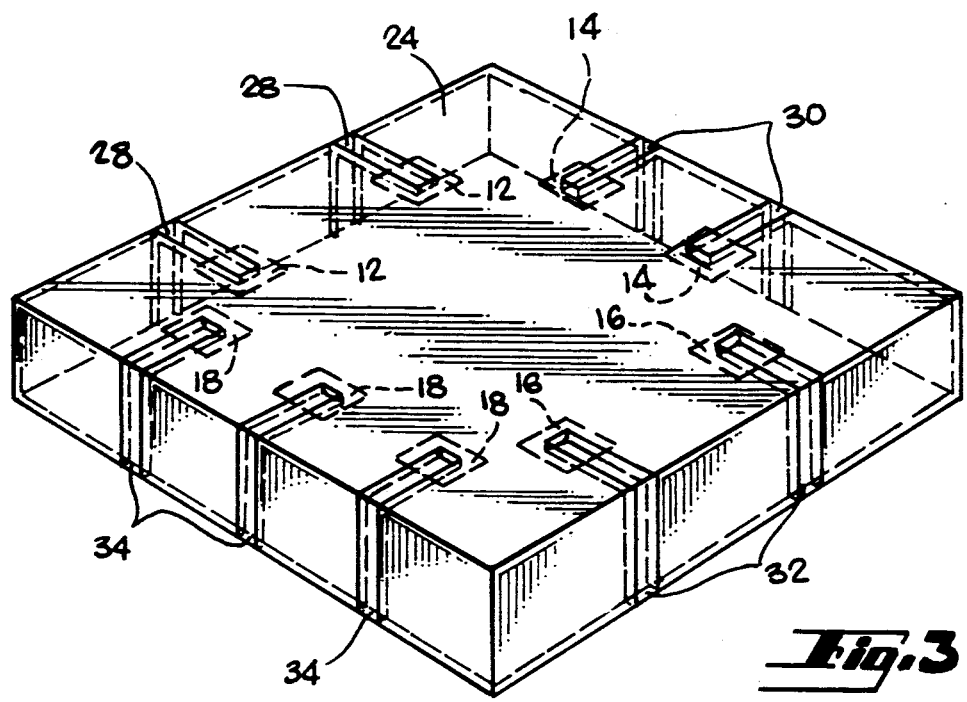
FIG. 3 is a perspective view of the mask and die of FIG. 1, after the sputtering of metal into openings of the mask.

With reference to FIGS. 1 and 2, an integrated circuit die 10 is shown as including a plurality of input/output contact pads 12, 14, 16 and 18 to permit electrical communication between the circuitry of the die 10 and outside circuitry. Typically, the die includes a greater number of contact pads 12-18. In fact, there may be hundreds of contact pads. However, the number of contact pads is not critical to the present invention and for the purpose of clarity, only a limited number are shown.

In a first step, the integrated circuit die 10 is inverted so that the active side 20 having the contact pads 12-18 faces downwardly. An insulating material 22, such as oxide, is then deposited on the passive surface and the lateral surfaces of the die. The insulating layer 22 acts to better isolate the die from a substrate to which the die is connected. Moreover, as will be explained more fully below, the insulating layer supports conductive traces extending from the input/output contact pads 12-18.

Shown in FIG. 1, aligned with the integrated circuit die 10 is a mask 24. The mask is dimensioned to slidably fit onto the die to house the active side 20 and lateral surfaces 26 of the die. In constructing the mask 24, a flat piece of metal, preferably molybdenum is cut away at its corners so that the outside edges of the material can later be folded downwardly to form the shape of the mask shown in FIG. 1. Prior to folding of the edges, a plurality of slots 28, 30, 32 and 34 are cut into the flat material, using laser technology. The slots are formed to define a pattern corresponding to the pattern of input/output contact pads 12-18. The inward ends of the slots extend to the contact pads. The edges of the material are then folded downwardly to form the mask 24 having a top 36 and four sides 38, as shown in FIG. 1. After coating of the passive surface and the lateral surfaces of the integrated circuit die 10 and after formation of the mask 24, the mask is placed over the die.

Figure 4:
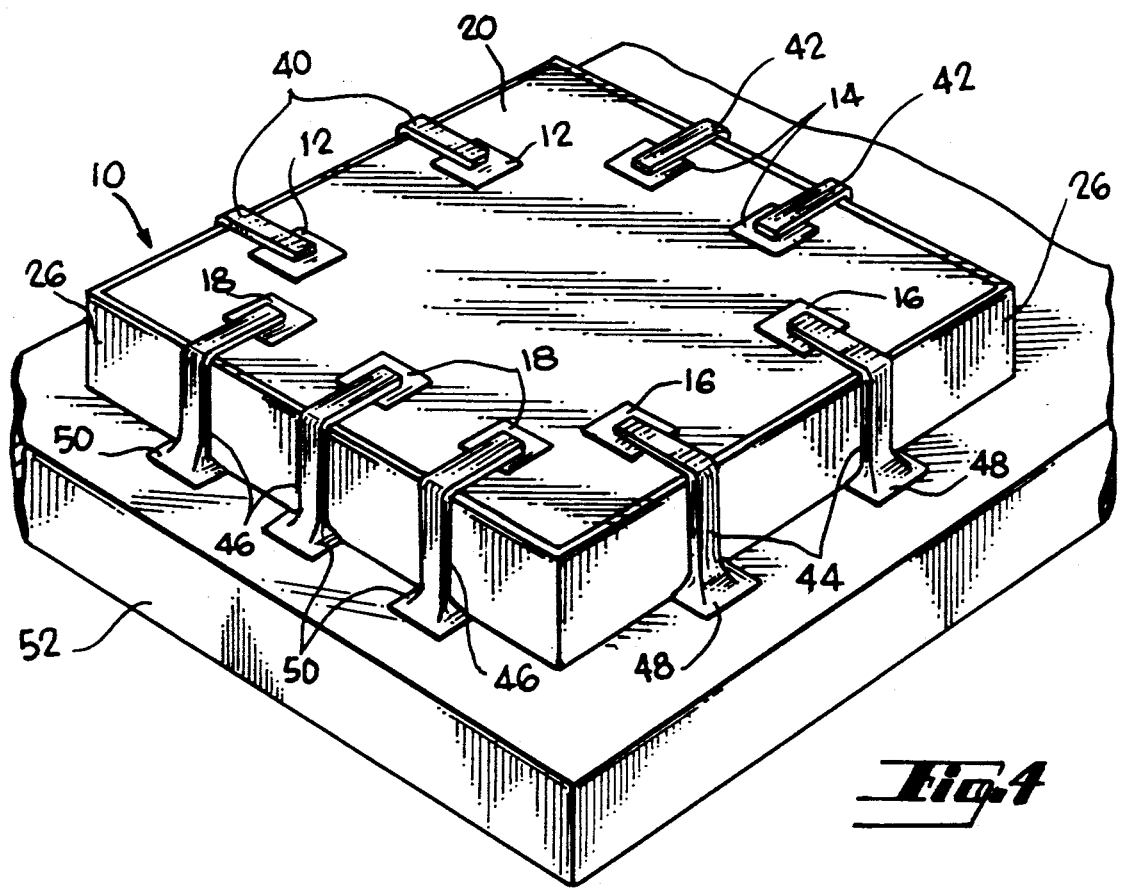
FIG. 4 is a perspective view of the die of FIG. 3 bonded to a substrate.

Referring now to FIG. 3, the inner ends of the slots 28-34 align with the input/output contact pads 12-18 of the die. The mask and die are then placed within a sputtering chamber to form localized traces of metal. In a preferred embodiment, the traces have a tri-metal composition of titanium, platinum and gold. The metal mask 24 is then removed from the die to provide an assembly of the die, coated on its passive side and lateral surfaces by an insulating layer, and conductive traces 40, 42, 44 and 46, as best seen in FIG. 4.

The conductive traces 40-46 are L-shaped members which extend from the input/output contact pads 12-18 of the die 10 and contact the active side 20 and the lateral surfaces 26 of the die. The conductive traces are preferably coterminus with the bottom edges of the lateral surfaces, but this is not critical. What is critical is that the conductive traces can be easily soldered to substrate contact pads 48 and 50 on a substrate 52. The bonding of the conductive traces to the substrate contact pads 48 and 50 may be by any means known in the art. For example, surface mount technology may be utilized. Predeposited solder on the substrate 52 may be heated to an elevated temperature to remelt the solder, whereafter solder solidification provides proper bonding of the conductive traces 40-46 to the substrate contact pads 48-50.

The substrate contact pads 48 and 50 are linked by traces, not shown, to other circuitry on the substrate 52. Thus, the L-shaped conductive traces 40-46 permit electrical communication between the integrated circuit die 10 and outside circuitry. The substrate 52 may be a printed circuit board or may be a substrate contained within a multi-chip module, wherein the substrate also includes other integrated circuit dies and, optionally includes a seal to hermetically seal the dies.

While the present invention has been illustrated and described as utilizing the mask 24 in deposition of the L-shaped conductive traces 40-46, other techniques may be employed to form the conductive traces. For example, photolithography may be utilized. Metal may also be sputtered onto the insulating layer 22 and then etched to create the L-shaped conductive traces.

One advantage of the present invention is that after deposit of the L-shaped conductive traces 40-46, the integrated circuit die 10 can be thoroughly tested and burned in. The conductive traces provide contacts which are more accessible than are bare input/output contact pads 12-18 of the die. Thus, a connector of the elastomeric type may be used for testing. Such a connector may be pressed against the lateral surfaces 26 of the die 10 for testing purposes. Testing at the die level ensures that only properly operating integrated circuit dies will undergo bonding to a multi-chip module. Other advantages include the savings of labor and materials following from bonding the die directly to the substrate.

I claim:

1. A method of making a carrierless electronic device for bonding directly to a substrate comprising, providing an integrated circuit die having opposed first and second major sides and having a plurality of lateral surfaces, said first major side having an array of conductive contact pads thereon, forming an electrically insulating layer of material on said second major surface and said lateral surfaces of said die, and forming traces of metallic material atop said first major surface and lateral surfaces so that each metallic trace extends from one of said contact pads on said first major surface and lies on said insulating layer formed on said lateral surfaces for termination substantially coplanar with said insulating layer formed on said second major surface, thereby allowing said traces to be bonded to a substrate brought into contact with said insulating layer on said second major surface.

2. The method of claim 1 wherein said step of forming traces is performed by a sputtering process to provide localized traces.

3. The method of claim 2 wherein said traces are localized by use of a mask having slots corresponding to the desired pattern of said traces.

4. The method of claim 1 further comprising the step of placing a mask on said first major surface and said insulating layer formed on said lateral surfaces, said mask having slots extending from said contact pads to the edges of said first major surface and further extending parallel to said lateral surfaces of said die.

5. The method of claim 4 further including sputtering metal into said slots to form said traces.

6. The method of claim 1 wherein said step of forming traces includes depositing gold.

7. The method of claim 4 wherein said mask is made of molybdenum.

8. A method of bonding an integrated circuit die to a substrate comprising,
providing a die having opposed first and second major surfaces and having an array of conductive pads on said first major surface,
patterning a plurality of conductive traces on said die to extend from said pads to edges of said first major surface and to further extend from said edges along sides of said die to corresponding edges of said second major surface, and
bonding said traces formed on said die to an array of connection sites on a substrate, said bonding including soldering said connection sites to said traces at said edges of said second major surface.

9. The method of claim 8 further comprising forming an electrically insulating layer of material on said second major surface and on side surfaces of said die prior to said step of patterning conductive traces, said conductive traces being on surfaces of said insulating layer parallel to said sides of said die.

10. The method of claim 8 wherein said step of patterning conductive traces is a step of forming L-shaped metallic traces.

11. The method of claim 10 wherein said forming said L-shaped metallic traces provides traces having first ends at said pads of said die and having second ends substantially along a plane defined by said second major surface.

12. The method of claim 9 wherein said step of forming said conductive traces includes placing a mask onto said first major surface of said die and onto said insulating layer on the sides of said die, said mask having a pattern of slots extending from said pads on said first major surface and along said insulating layer of said sides of the die, said forming of said conductive traces further including depositing metal within said slots.

13. The method of claim 12 wherein said step of forming said conductive traces includes sputtering said metal within said slots, said mask being removed after said sputtering.

14. The method of claim 9 wherein said material on said surfaces is oxide.

* * * * *